United States Patent [19]
McDavid

[11] 3,988,620
[45] Oct. 26, 1976

[54] TRANSDUCER HAVING ENHANCED ACCELERATION CANCELLATION CHARACTERISTICS

[75] Inventor: William T. McDavid, Richardson, Tex.

[73] Assignee: Aquatronics, Inc., Dallas, Tex.

[22] Filed: May 24, 1972

[21] Appl. No.: 256,358

Related U.S. Application Data

[63] Continuation-in-part of Ser. No. 202,316, Nov. 26, 1971, abandoned.

[52] U.S. Cl. .............................. 310/8.6; 310/9.1; 310/9.4; 340/10
[51] Int. Cl.$^2$ ........................................ H01L 41/08
[58] Field of Search ............... 310/8.4, 8.6, 9.1–9.4, 310/9.8; 340/10

[56] References Cited
UNITED STATES PATENTS

| | | | |
|---|---|---|---|
| 2,448,365 | 8/1948 | Gillespie | 340/10 |
| 3,147,391 | 9/1964 | Darrel et al. | 310/8.4 |
| 3,153,156 | 10/1964 | Watlington | 310/8.6 |
| 3,158,762 | 11/1964 | Horan | 310/8.6 |
| 3,187,300 | 6/1965 | Brate | 340/10 |
| 3,202,962 | 8/1965 | Elston | 340/10 |
| 3,249,912 | 5/1966 | Straube | 340/10 |
| 3,311,873 | 3/1967 | Schloss | 340/10 |
| 3,320,582 | 5/1967 | Sykes | 340/10 |
| 3,351,903 | 11/1967 | Straube | 340/10 X |
| 3,438,021 | 4/1969 | Nelkin et al. | 310/8.5 X |
| 3,458,857 | 7/1969 | Hancks et al. | 340/10 |
| 3,660,809 | 5/1972 | Pearson | 340/10 X |

*Primary Examiner*—Mark O. Budd
*Attorney, Agent, or Firm*—Wofford, Felsman, Fails & Zobal

[57] ABSTRACT

The specification discloses a pressure-sensitive transducer including two spaced pressure-sensitive subassemblies having matched parameters and which are electrically coupled together in a manner to minimize the effect of acceleration on the transducer. In one embodiment, each subassembly comprises a pair of piezoelectric crystals attached to opposite sides of a conductive mounting plate. The two plates are supported on opposite sides of an insulated annular spacer ring in a manner to face like poled surfaces of the crystals in the same directions. The crystals are electrically coupled together in parallel by conductors which couple each pair of crystals of a subassembly together and to the mounting plate of the other assembly.

4 Claims, 17 Drawing Figures

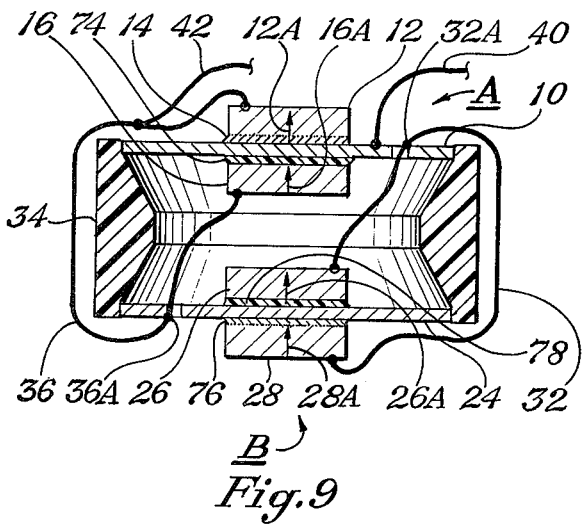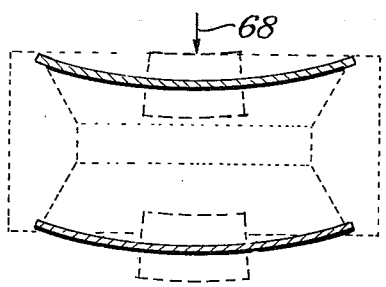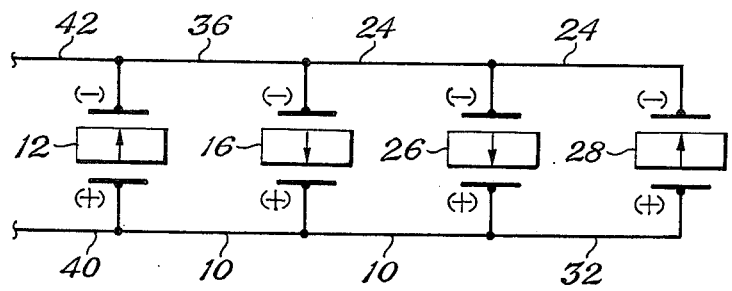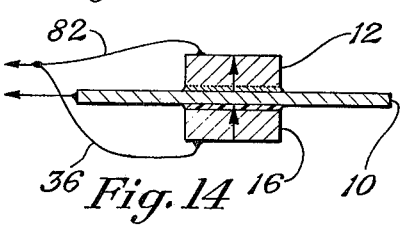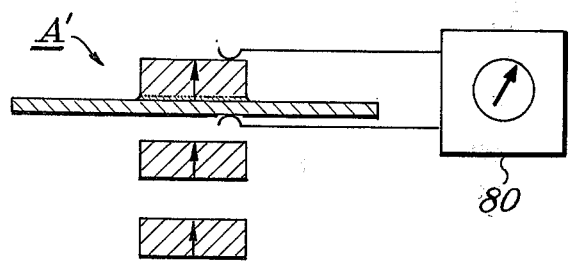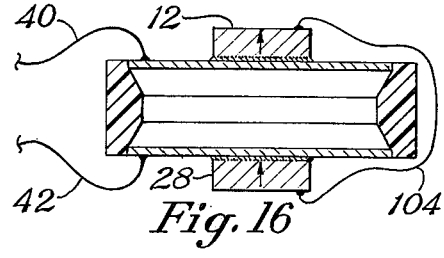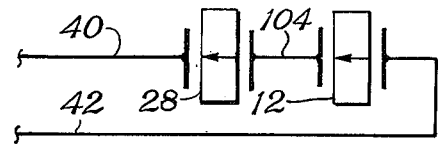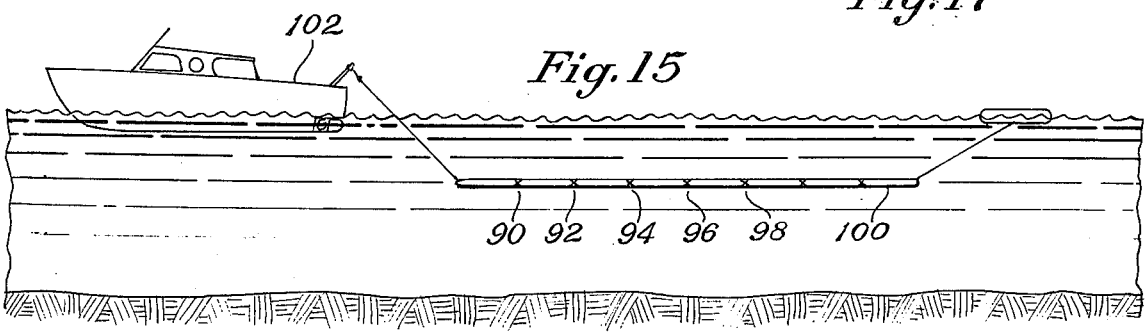

TRANSDUCER HAVING ENHANCED ACCELERATION CANCELLATION CHARACTERISTICS

This application is a continuation-in-part application of Application Ser. No. 202,316, filed Nov. 26, 1971 now abandoned.

FIELD OF THE INVENTION

This invention relates to pressure-sensitive transducers, and more particularly relates to transducer assemblies having enhanced acceleration cancellation characteristics.

THE PRIOR ART

Piezoelectric transducers are commonly utilized for a variety of purposes, including utilization as hydrophones in marine seismic exploration systems. In such systems, the transducers conventionally are located in a streamer which is towed in water behind a boat as a sound source is actuated to generate seismic or acoustic energy which travels through the water to the subsurface formations. Energy reflected or refracted from the subsurface formations travels back to the surface through the water and is detected in the water, in the form of pressure variations, by the transducers located in the streamer. As the streamer is being towed, however, wave action and undesired motion of the boat causes the streamer to be jerked or accelerated which results in the production of an undesirable output voltage or noise by the transducers. It is desirable that the noise, due to the effect of acceleration, be minimized in order to obtain the best data possible.

It has been previously known to connect transducers in a configuration such that the effects of acceleration on the transducers tend to be cancelled. However, previously developed transducer assemblies have not been completely satisfactory with respect to adequate cancellation of acceleration effects. Furthermore, many previously developed transducer devices have been relatively complex in structure and assembly and hence are relatively expensive to produce.

SUMMARY OF THE INVENTION

It is an object of the present invention to provide a pressure-sensitive transducer assembly having enhanced acceleration cancellation characteristics.

It is a further object of the present invention to provide a pressure-sensitive transducer assembly which is relatively easy to assemble and produce and which allows one to obtain an increased total capacitance in a small size package.

In one aspect, the transducer assembly comprises first and second pressure-sensitive means supported on opposite sides of a spacing means. The pressure-sensitive means are characterized by the production of electrical outputs in response to force acting thereon. The first pressure-sensitive means has an electrical parameter which matches that of the second pressure-sensitive means. They are coupled together electrically in a manner such that the electrical outputs oppose each other when a force, due to acceleration, acts on both pressure-sensitive means in a given direction and reinforce each other when a force, due to pressure, acts on both pressure-sensitive means in opposite directions.

The parameters matched may be in the capacitance, charge output or voltage output of the two pressure-sensitive means.

Each pressure-sensitive means may comprise a single piezoelectric crystal attached to one side of a mounting plate or two piezoelectric crystals attached to opposite sides of a mounting plate.

In a further aspect, the mounting plates are formed of conductive material while the spacing means is formed of electrically insulating material.

By forming the transducer from two subassemblies, each comprising two crystals attached to opposite sides of a conductive mounting plate and by electrically coupling the crystals together in parallel, increased capacitance can be obtained from a transducer assembly of small size. Assembly of such a device is facilitated by orienting the crystals such that poled surfaces of like polarity face the same direction and by employing criss-cross connections wherein electrical conductors are provided for coupling each pair of crystals of a subassembly together and to the mounting plate of the other assembly.

BRIEF DESCRIPTION OF THE DRAWINGS

For a more complete understanding of the present invention and for further objects and advantages thereof, reference is now made to the following description taken in conjunction with the accompanying drawings, in which:

FIG. 9 is a sectional view of the transducer assembly similar to that of FIG. 3 but showing in more detail the polarity of the poled surfaces of the piezoelectric crystals as well as their manner of connection to the mounting plates;

FIG. 10 is an electrical schematic of the connections of FIGS. 3 and 9;

FIG. 11 illustrates forces applied to the transducer assembly due to pressure in water;

FIG. 12 illustrates forces applied to the transducer assembly due to acceleration;

FIG. 13 is a sectional view of the transducer assembly illustrating the manner of obtaining measurements of the components thereof during assembly;

FIG. 14 is a sectional view of one of the subassemblies illustrating connections to the components thereof for obtaining measurements;

FIG. 15 illustrates a plurality of the transducer assemblies located in a streamer towed in water behind a marine seismic boat;

FIG. 16 is a further embodiment of a transducer assembly wherein the piezoelectric crystals are coupled together in series; and FIG. 17 is an electrical schematic of the connections of FIG. 16.

DETAILED DESCRIPTION OF THE INVENTION

Figure 3:
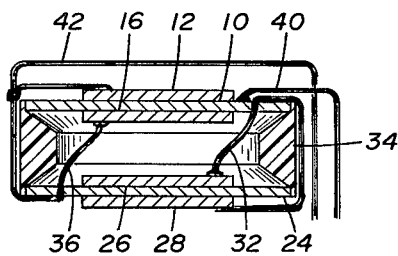
FIG. 3 is a sectional view of the completed transducer assembly of the invention prior to being placed in a housing.

Referring to FIGS. 3 and 9, the transducer assembly comprises two subassemblies supported on opposite sides of an annular spacer ring 34 formed of electrical insulating material. The transducer is constructed and assembled in a manner such that an electrical parameter of the one subassmbly matches that of the other subassembly to cancel the effect of acceleration on the transducer. The parameters matched may be the capacitance of the subassemblies, or their charge or voltage outputs in response to a force. Preferably the force is applied by acceleration. The matching of capacitance will be described initially.

In the embodiment of FIGS. 3 and 9, one subassembly, designated as A, comprises a pair of piezoelectric crystal discs 12 and 16 conductively attached to opposite sides of a conductive mounting plate or disc 10 which may be of brass. The other subassembly, designated as B, compriss a pair of piezoelectric crystal discs 26 and 28 conductively attached to opposite sides of a second mounting plate or disc 24 which also is of brass. The combined capacitance of the crystals 12 and 16 of subassembly A is equal to the combined capacitance of the crystals 26 and 28 of subassembly B.

The crystals also are oriented and electrically connected together in a manneer such that pressure forces in the water due to seismic or acoustic energy results in the production of an output voltage representative of the seismic energy. This same orientation and electrical connections results in the potential developed across the crystals of one subassembly opposing the potential developed across the crystals of the other subassembly in response to acceleration on the transducer assembly. Since the combined capacitance of one pair of crystals matches or is equal to that of the other pair of crystals, enhanced cancellation of the output potentials developed across the crystals is achieved in response to acceleration. Thus the effect of acceleration on the transducer assembly is minimized.

Figure 1:
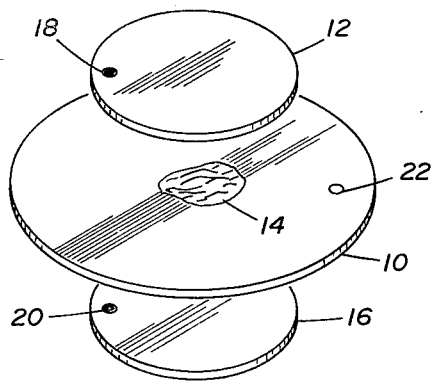
FIG. 1 illustrates an exploded view of one of the transducer subassemblies according to the invention.

Due to the manner of manufacture of the piezoelectric crystals, each crystal is polarized with the axis of polarization being perpendicular to its flat faces. The polarization is achieved by applying a positive voltage to one surface of the crystal with respect to its opposite surface while the crystal is at an elevated temperature. In FIG. 1, the positive poled surfaces of crystals 12 and 16 are designated by dots 18 and 20, respectively. In FIG. 9, the arrows 12A, 16A, 26A, and 28A designate the polarity of the poled surfaces, the tip or head of the arrows designating the positive poled surfaces and the tail of the arrows designating the negative poled surfaces. Each crystal is characterized in that radial compression thereof results in the production of a potential at its positive poled surface which is negative with respect to its opposite surface while radial expansion results in the production of a potential at its positive poled surface which is positive with respect to its opposite surface.

As can be seen in FIG. 9, te crystals are attached to their mounting plates and the plates attached to the ends of the spacer ring 34 in such a manner that like poled surfaces of all of the crystals face the same direction. Moreover, the crystals are electrically coupled together in parallel by conductors 32 and 36 and mounting plates 10 and 24. In this respect, conductor 32 is connected to the positive poled surface of crystal 26 and to the negative poled surface of crystal 28. It is also connected to plate 10 at 32A and hence to the positive poled surface of crystal 16 by way of the conductive plate 10. Conductor 36 is connected to the positive poled surface of crystal 12 and to the negative poled surface of crystal 16. It is also connected to plate 24 at 36A and hence to the negative poled surface of crystal 26 by way of conductive plate 24. Plate 10 connects the negative poled surface of crystal 12 to the positive poled surface of crystal 16 while plate 24 connects the negative poled surface of crystal 26 to the positive poled surface of crystal 28. Terminal 40 is connected to plate 10 while terminal 42 is connected to conductor 36. The electrical schematic of the parallel connection is illustrated in FIG. 10.

In operation of the transducer assembly in water, pressure increases, for example, due to the effect to the seismic energy passing through the water, will act on both subassemblies in opposite directions as depicted by arrows 60 and 62 in FIG. 11 to bend or force the subassemblies inward as illustrated in exaggerated form in FIG. 11. This will result in crystals 12 and 28 being radially compressd and crystals 16 and 26 being radially expanded. Due to the orientation and manner of connection of the crystals, the polarity of the potential produced at the positive poled surfaces of crystals 12 and 28 and at the negative poled surfaces of crystalls 16 and 26 will be the same. A potential of opposite polarity will be produced at the opposite poled surface of each of the crystals. In FIG. 10, a minus (−) polarity is illustrated as being produced at the positive poled surfaces of crystals 12 and 28 and at the negative poled surfaces of crystals 16 and 26 due to the inward acting forces depicted by arrows 64 and 66.A plus (+) polarity will be produced at the crystal's opposite surfaces. Thus the potentials developed across each of the crystals will reinforce each other whereby an output voltage will be produced which is representative of the pressure force applied to the transducer assembly.

If the transducer assembly however experiences forces due to acceleration, the forces will be applied to both subassemblies in the same direction for example as depicted by the arrow 68 in FIG. 12. Both subassemblies then will be forced or bent in the same direction as illustrated in exaggerated form in FIG. 12. When this occurs, crystals 12 and 26 will be compressed radially and crystals 16 and 28 expanded radially. When this occurs, the polarity of the potential produced across crystals 12 and 16 will be opposite that produced across crystals 26 and 28. For example, due to the effect of acceleration, the polarity of the potential produced at the positive and negative poled surfaces of crystals 12 and 16, respectively, will be minus (−) while that produced at the negative and positive poled surfaces of crystals 26 and 28, respectively, will be positive (+). The reverse polarity will be produced at the crystal's opposite poled surfaces. Thus the potential produced across crystals 12 and 16 will be opposed by the potential produced across crystals 26 and 28. Since the combined capacitance of crystals 12 and 16 matches that of the combined capacitance of crystals 26 and 28, cancellation of the potentials across the crystals will be enhanced to produce an output voltage which is a minimum. This can be more readily understood from the following mathematical relationships.

$$V_o = \frac{Q_{12} + Q_{16} + Q_{26} + Q_{28}}{C_{12} + C_{16} + C_{26} + C_{28}} \quad (1)$$

wherein:

$V_o$ is the voltage output at terminals 40 and 42, $Q_{12}$, $Q_{16}$, $Q_{26}$, and $Q_{28}$ are the charge on crystals 12, 16, 26 and 28 respectively, and $C_{12}$, $C_{16}$, $C_{26}$, and $C_{28}$ are the capacitance of crystals 12, 16, 26, and 28 respectively.

Since
$$Q = VC \quad (2)$$

$$V_o = \frac{V_{12}C_{12} + V_{16}C_{16} + V_{26}C_{26} + V_{28}C_{28}}{C_{12} + C_{16} + C_{26} + C_{28}} \quad (3)$$

wherein:

$V_{12}$, $V_{16}$, $V_{26}$, and $V_{28}$ is the difference in potential across crystals 12, 16, 26 and 28 respectively.

Due to the effect of acceleration, $V_{12}$ and $V_{16}$ will have a polarity opposite that of $V_{26}$ and $V_{28}$.

Assuming that $V_{12}$, $V_{16}$, $V_{26}$ and $V_{28}$ are equal in magnitude and hence equal to V $$V_o = \frac{V[-(C_{12} + C_{16}) + (C_{26} + C_{28})]}{C_{12} + C_{16} + C_{26} + C_{28}} \quad (4)$$

Thus if $C_{12} + C_{16}$ equals $C_{26} + C_{28}$, a voltage output of zero will be produced due to the effect of acceleration.

The manner in which the transducer of FIGS. 3 and 9 is assembled and constructed now will be described. The crystals employed may be of the ceramic type manufactured and sold by Gulton Industries, Inc. These crystals are silvered on both sides. In constructing each subassembly, one crystal is soldered to one side of the mounting plate while the other crystal is bonded to the other side of the mounting plate with a conductive epoxy glue. Soldering has advantages since it can be done faster and cheaper, however, it tends to reduce the capacitance of the crystal. Moreover, difficulties were experienced in soldering crystals to opposite sides of the mounting plate. Hence one crystal is soldered to one side for ease of assembly while the other crystal is glued to the other side to produce an acceptable total capacitance. In constructing each subassembly, the soldering step is carried out initially followed by the bonding step. Soldering is carried out at low temperatures to avoid weakening the silver coating and to minimize the reduction of capacitance. In addition, since the expansion coefficients of the brass disc 10 and the ceramic crystals are different, a high temperature during soldering is avoided to avoid the creation of stress problems which may otherwise occur after the assembly cools.

In producing the subassembly A, the negative poled surface of crystal 12 is soldered to the top side of plate 10 while the positive poled surface of crystal 16 is bonded to the bottom side thereof. The solder connection is illustrated at 14 while the conductive epoxy connection is illustrated at 74. In the production of subassembly B, the positive poled surfaces of crystal 28 is soldered to the bottom side of plate 24 while the negative poled surface of crystal 26 is bonded to the top side thereof. The solder connection for this subassembly is illustrated at 76 while the conductive epoxy connection is illustrated at 78. The solder connection is located on the outside of the plates 10 and 24 to obtain a more structurally sound transducer assembly.

In the matching of capacitance, the following procedure is carried out. Assume that it is desired to produce a number of transducer assemblies wherein the four crystals of each transducer assembly have a total capacitance of about 36 nanofarads when added together in parallel. In order to obtain this total value, each subassembly will be assembled and formed such that the combined capacitance of its pair of crystals will be equal to the center valve of 18 nanofarads. The transducers will be assembled from a batch of crystals each of which may have a capacitance in the range of 10±1 nanofarads. Initially the capacitance of all of the crystals of the batch will be measured to insure that their values fall within the capacitance range desired. This can be done with a conventional capacitance meter illustrated at 80 in FIG. 13. A crystal 12 then is selected and its negative poled surface soldered to plate 10 to obtain partial subassembly A' as illustrated in FIG. 13. Since soldering reduces the capacitance of the crystal, the resulting capacitance then is measured and the value noted. This value for example may be 7.5 nanofarads. Measuring is carried out across the partial subassembly A' with the meter 80 as illustrated in FIG. 13. The partial subassembly A' then is placed into a group having about the same value of capacitance. In this manner a large number of such subassemblies A' are formed, measured, and sorted.

Figure 2:
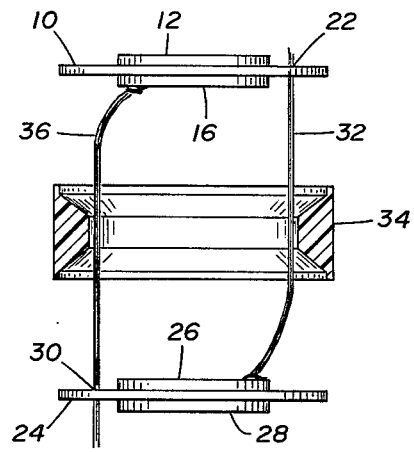
FIG. 2 is a partial sectioned view of the present transducer assembly during a step of assembly.

In the above example wherein it is desired to obtain a combined capacitance of 18 nanofarads for a crystal pair, a partial subassembly A' will be paired with a crystal such that their total capacitance is equal or substantially equal to 18 nanofarads. This center value may be obtained by a relatively large number of combinations of crystals and partial subassemblies whereby an increased number of transducer assemblies whereby an increased number of transducer assemblies may be formed from a given batch of crystals. For example a 7.5 nanofarads partial subassembly A' may be paired with 10.5 nanofarad crystal or a 8 nanofarad partial subassembly A' paired with a 10 nanofarad crystal to obtain the desired center value of 18 nanofarads for the crystal pair of the subassembly. The crystal selected to be paired, is bonded to the partial subassembly A' to form the subassembly A. Conductor 36 next is attached to the bottom (negative poled surface) of crystal 16 as illustrated in FIG. 2. A further measurement is made of the capacitance of the subassembly to determine exactly the total capacitance thereof. This may be carried out as illustrated in FIG. 14 by temporarily connecting a lead 82 to the top of crystal 12 and to the conductor 36 for connection to one terminal of the capacitance meter. The other terminal of the meter is connected to the plate 10 to obtain a measure of the capacitance in parallel of the two crystals of the subassembly. The combined capacitance may be equal to 18 nanofarads or slightly less or greater. The total capacitance is noted and the subassembly A is placed in a group having substantially the same value.

The subassembly B is constructed and matched in a similar manner. In this respect, a crystal 28 will have its positive poled surface soldered to a mounting plate 24 to form the partial subassembly B' (see FIG. 13). The capacitance of the partial subassembly B' is measured and the partial subassembly sorted into a group depending upon the value of the capacitance. A plurality of partial subassemblies B' will be assembled, measured and sorted. In forming the subassembly B, a partial subassembly B' will be paired with a crystal such that their total capacitance is equal to or substantially equal to the mid-point value desired. This may be 18 nanofarads as indicated above. Again this center value may be achieved by a number of combinations of crystals and partial subassemblies. After the crystal to be paired is selected it is bonded to the partial subassembly B' to form the subassembly B. Conductor 32 then is attached to the top (positive poled surface) of crystal 26 and a further measurement made of the total capacitance of the subassembly in the manner as described previously with respect to FIG. 14. After this measurement, the subassembly B is sorted depending upon its capacitance.

In matching subassemblies A and B to form the final product, a subassembly A will be paired with a subassembly B which has the same or substantially the same total capacitance as that of subassembly A.

Figure 4:
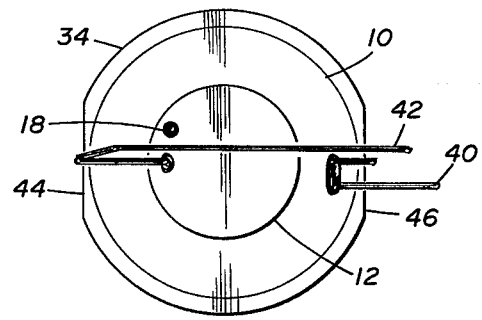
FIG. 4 is a top view of the assembly shown in FIG. 3.

Referring now to FIGS. 1–6, the final assembly steps will be described. An aperture 22 is formed through plate 10 while an aperture 30 is formed through plate 24. These apertures are formed in the plates prior to attachement of the crystals thereto and are employed to facilitate interconnection and assembly of the subassemblies. In assembling the subassemblies A and B to the spacer ring 34, the conductive wire 36 is disposed through the center of the spacer ring 34 and through the aperture 30 of the brass plate 24. Similarly conductive wire 32 is disposed through the center of spacer ring 34 and through the aperture 22. The subassemblies then are snapped into place within the spacer ring such that the brass plates or discs 10 and 24 are mounted at the edges thereof within the grooved portions formed around the edges of the spacer ring 34. The conductive wire 32 is soldered to plate 10 at 32A and then bent around the outside of the spacer ring 34 and soldered to the negative poled surface of the crystal 28. Exterior wire 40 then is soldered to the wire 32 or to the top surface of the plate 10 to serve as one terminal of the transducer assembly. Similarly the wire 36 is soldered to plate 24 at 36A and then bent around the edges of the spacer ring 34 and soldered to the positive poled surface of the crystal 12. Wire 42 then is soldered to wire 36 to serve as the other terminal of the transducer assembly. Thus connection of the four crystals in parallel is achieved in a simple manner thereby facilitating assembly. FIG. 4 illustrates a top view of the assembly shown in FIG. 3. In some instances, it may be necessary to utilize insulating tape between portions of the wires 32 and 36 and the brass plates 10 and 24 to prevent undesired electrical contact. As is shown in FIG. 4, the opposed edge portions 44 and 46 of the spacer ring 34 are removed or cut flat in order to accommodate the leads of the assembly to facilitate fitting into a circular insulating housing.

Figure 5:
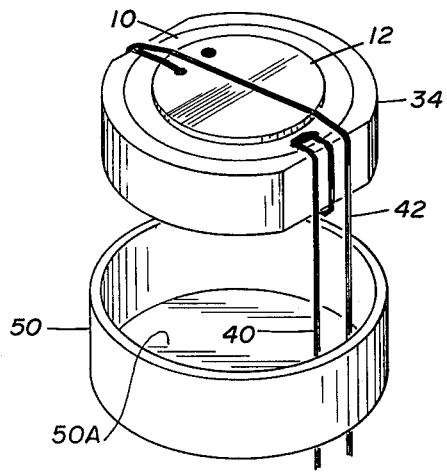
FIG. 5 is a perspective view of the assembly shown in FIGS. 3 and 4 during insertion into a housing.
Figure 6:
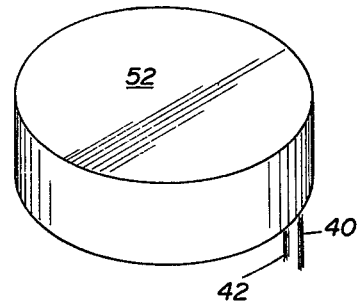
FIG. 6 illustrates the assembly shown in FIG. 5 after completion of encasement into a housing.

FIG. 5 illustrates the insertion of the assembly of FIGS. 3 and 4 into a rubber boot 50 having a closed bottom end 50A. Holes are drilled through the bottom end of the boot 50 in order to allow the passage of leads 40 and 42 therethrough. Once the assembly is snugly fitted within the rubber boot 50, an insulating potting compound 52 is applied over the open end of the boot 50 to completely seal the transducer assembly. The center of the transducer assembly is maintained free of the potting compound in order to allow the plates to bend and flex in response to pressure or force to obtain the desired transducer action. In the preferred embodiment, the rubber boot 50 is comprised of urathane. The transducer assembly shown in FIG. 6 then is ready to be interconnected into a hydrophone or a streamer assembly. FIG. 15 illustrates a plurality of the transducer assemblies located at spaced positions, 90, 92, 94, 96, and 98, in a seismic streamer 100 which is towed in the water behind a boat 102 to detect for seismic energy in marine seismic operations.

Figure 7:
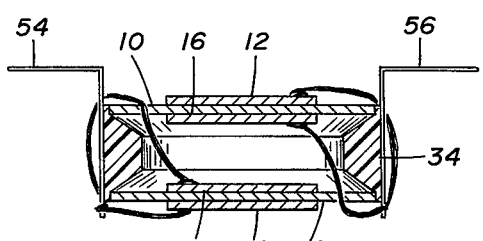
FIG. 7 is a sectional view of a second embodiment of a transducer assembly according to the invention.
Figure 8:
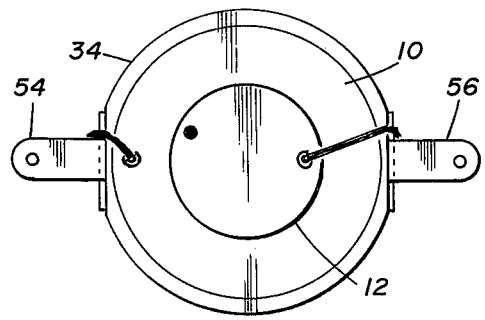
FIG. 8 is a top view of the embodiment of the invention shown in FIG. 7.

FIGS. 7 and 8 illustrate a second embodiment of the present invention. This embodiment is constructed in an identical manner as that previously described, with the exception that rigid connector terminals 54 and 56 are utilized in place of the exterior leads. Terminals 54 and 56 are rigidly connected to the plastic spacer ring 34. The transducer subassemblies then are press-fitted into the spacer ring 34 and the leads are interconnected in the manner previously described. The leads, however, are wound about the rigid connector terminals 54 and 56 and solder is applied thereto in order to provide a good electrical connection.

As mentioned previously, instead of matching the capacitance of the two subassemblies, it may be desirable to match the charge output instead. This had advantages since improved cancellation due to the effect of acceleration can be achieved. For example, the piezoelectric coefficients of the crystals may vary slightly as well as the thickness of the mounting plates. Thus the voltage produced across each crystal pair, when stressed, may be different even though the capacitance of one subassembly is matched with that of the other. For example referring to equations (3) and (4), $V_{12}$, $V_{16}$, $V_{26}$, and $V_{28}$ may not be equal in magnitude as assumed. If this occurs, even though the combined capacitance of $C_{12}$ and $C_{16}$ equals the combined capacitance of $C_{26}$ and $C_{28}$, the output voltage may not be zero.

Improved cancellation due to the effect of acceleration however can be obtained by matching the combined electrical output, due to acceleration, of one subassembly with that of the other rather than the capacitance. The theoretical ideal for complete cancellation of acceleration effects requires the matching of charge outputs in response to acceleration for parallel connected crystals and the matching of voltage outputs in response to acceleration for series connected crystals.

Since the charge can be defined as VC, as expressed by equation (2), the matching of charges will take into account possible variations in voltage outputs whereby improved results can be obtained. The charge outputs of the two subassemblies are matched by selecting the subassemblies such that $Q_{12} + Q_{16}$ is equal to $Q_{26} + Q_{28}$. In this embodiment, the two subassemblies A and B are assembled in the same manner previously described, however, the final matching step is that of matching charge outputs instead of capacitance. For example, a total combined capacitance of a selected value for the four crystals will be set as the initial goal to be achieved. Partial subassembly A' will be paired with a crystal to obtain a combined capacitance of crystals 12 and 16 which is at the mid-point of the selected value. The crystal selected will be bonded to the partial subassembly A' to form subassembly A. Similarly the partial subassembly B' will be paired with a crystal to obtain a combined capacitance of crystals 26 and 28 which is also at the mid-point of the selected total value. The crystal selected will be bonded to the partial subassembly B' to form subassembly B. Subassembly A then will be paired with a subassembly B which has the same or substantially the same total charge output as that of subassembly A. The charge output may be determined by accelerating a subassembly (in a carefully calibrated vibrating device) while measuring the total charge output of both crystals with a standard charge measuring amplifier. Referring again to FIG. 14, the charge output of subassembly A may be measured by temporarily connecting the conductor 82 to crystal 12 and to the conductor 36. These conductors then will be coupled to one terminal of the charge measuring device while the other terminal is coupled to the conductive plate 10 to obtain measurements in parallel of the charge output of both of the crystals of the subassembly. The charge output may be measured in picocoulombs per g (charge output per unit of acceleration).

Although the matching of charge outputs has advantages due to improved cancellation features, it has disadvantages however in that it is more difficult in that it requires not only an electrical measurement to be carried out but also requires the subassemblies to be subjected to a calibrated deflecting force such as that generated by the vibrating device.

A deflecting force also can be applied by acoustical means. The validity of the match resulting from the measurements employing the acoustical means depends on the assumption that the mass of each subassembly is substantially the same. The measurement in this instance is the charge output per unit of pressure.

In the above embodiment, the transducer assembly was described as being formed from four piezoelectric crystals coupled together in parallel. This is desirable in order to obtain an increased total capacitance in order to enhance the response of the transducer assembly to seismic energy at the lower frequency band. It is to be understood however that the transducer assembly may comprise only two piezoelectric crystals coupled together in parallel. This may be accomplished for example by eliminating crystals 16 and 26 and their inside conductor connections and electrically coupling crystal 12 to plate 24 by conductor 36 and crystal 28 to plate 10 by conductor 32. In this embodiment, the charge output or capacitance of crystal 12 will be set equal to the charge ouput or capacitance of crystal 28 to obtain the desired cancellation due to the effect of acceleration on the transducer.

Although the coupling of crystals together in parallel has advantages in that the capacitance of each crystal will be added directly in response to pressure variations, it is to be understood that the crystals of the transducer assembly may be coupled together in series instead. Such an arrangement is illustrated in FIG. 16 wherein the top subassembly comprises crystal 12 soldered to plate 10 while the bottom subassembly comprises crystal 28 soldered to plate 24. The positive poled surface of crystal 12 is coupled to the negative poled surface of crystal 28 by way of conductor 104. The electrical schematic of this connection is illustrated in FIG. 17. Again the crystals are oriented and connected together in a manner such that their potentials developed reinforce each other in response to pressure variations and oppose each other in response to acceleration. In this embodiment, the capacitance or voltage output of each subassembly may be matched. Preferably the voltage output per unit of acceleration is matched for the series connection as indicated above, to minimize the effect of acceleration on the transducer assembly. In the matching of voltage outputs a voltage meter will be employed instead of a charge meter to measure the voltage output across a subassembly as a deflecting force is applied to the subassembly. The unit of measurement is volts per unit of acceleration or volts per unit of pressure depending on the type of force applied. The deflecting force preferred is that due to acceleration.

In one embodiment, the transducer assembly of FIGS. 3 and 9 was formed of components having the following dimensions. The supporting ring 34 had an outside diameter of seven-eighths of an inch and a height of 0.3 of an inch. It was formed of acrylic. The brass plates each had a diameter of 0.75 of an inch and a thickness of 0.025 of an inch. Each piezoelectric crystal had a diameter of 0.55 of an inch and a thicknes of 0.010 of an inch. A transducer assembly of the configuration of FIGS. 3 and 9 has produced acceleration immunity of 80db g/bar maximum in all planes. This transducer assembly has omnidirectional characteristics over the seismic frequency band with a nominal sensitivity of −91db volts per microbar or greater. The preferred embodiment of the invention is provided with a nominal capacitance of 30 nanofarads or greater, with a pressure range of no more than 1db sensitivity over 0–50psi range. The transducer assembly may be subjected to at least 150psi without permanent change of operating characteristics. In one embodiment of the transducer assembly, a frequency response of ±0.5db, 1Hz - 1KHz was provided.

Whereas the present invention has been described with respect to specific embodiments thereof, it will be understood that various changes and modifications will be suggested to one skilled in the art, and it is intended to encompass such changes and modifications as fall within the scope of the appended claims.

I claim:

1. A transducer assembly for sensing pressure variations in a fluid medium, comprising:
   a piezoelectric element conductively attached to one side of a first conductive mounting plate to form a first subassembly,
   a piezoelectric element conductively attached to one side of a second conductive mounting plate to form a second subassembly,
   each element having opposite facing surfaces,
   each element being polarized such that its opposite facing surfaces have opposite polarities,
   the element attached to said first conductive mounting plate having a surface of one polarity attached to said one side of said first conductive mounting plate,
   the element attached to said second mounting plate having a surface of a polarity opposite said one polarity, attached to said one side of said second conductive mounting plate,
   an electrical insulating spacng means having an aperture extending therethrough between opposite supporting ends,
   said first and second mounting plates being supported at said opposite ends respectively of said spacing means in a manner to face the unattached surfaces of said elements in opposite directions and to face surfaces of like polarity of said elements in the same direction, and
   means for electrically connecting said piezoelectric elements together in parallel,
   said two mounting plates are supported at the opposite ends of said spacing means in a manner to face the unattached surfaces of said elements outward in opposite directions,
said means for electrically connecting said piezoelectric elements together in parallel comprising:
electrical conductive means electrically connecting said first mounting plate with the unattached surface of said element attached to said second mounting plate,
electrical conductive means electrically connecting said second mounting plate with the unattached surface of said element attached to said first mounting plate,
said electrical conductive means being located on the outside of said spacing means.

2. The transducer assembly of claim 1, wherein:
the capacitance of the element of one subassembly matches the capacitance of the element of the other subassembly.

3. A transducer assembly for sensing pressure variations in a liquid medium, comprising:
first and second pairs of piezoelectric elements,
each element having opposite facing surfaces,
each element being polarized such that its opposite facing surfaces have opposite polarities,
the elements of said first pair having surfaces of opposite polarity conductively attached to opposite sides of a first conductive mounting plate to form a first subassembly,
the elements of said second pair having surfaces of opposite polarity conductively attached to opposite sides of a second conductive mounting plate to form a second subassembly,
an electrical insulating spacing means having an aperture extending therethrough between opposite supporting ends,
said first and second mounting plates being supported at said opposite ends respectively of said spacing means in a manner to face surfaces of like polarity of said elements in the same direction, and
means for electrically connecting said piezoelectric elements together in parallel,
the size of the elements of each pair are smaller in cross section than the cross section of their respective mounting plates in the plane of said plates,
said means for electrically connecting said piezoelectric elements together in parallel comprising:
first conductive means electrically coupling the unattached surfaces of said first pair of elements together and to said second mounting plate,
second conductive means electrically coupling the unattached surfaces of said second pair of elements together and to said first mounting plate,
said first conductive means extends on the outside of said spacing means from the outer element of said first pair to said second mounting plate and through said second mounting plate to the inner element of said first pair,
said second conductive means extends on the outside of said spacing means from the outer element of said second pair to said first mounting plate and through said first mounting plate to the inner element of said second pair.

4. A transducer assembly for sensing pressure variations in a liquid medium, comprising:
first and second pairs of piezoelectric elements,
each element having opposite facing surfaces,
each element being polarized such that its opposite facing surfaces have opposite polarities, the elements of said first pair having surfaces of opposite polarity conductively attached to opposite sides of a first conductive mounting plate to form a first subassembly,
the elements of said second pair having surfaces of opposite polarity conductively attached to opposite sides of a second conductive mounting plate to form a second subassembly,
an electrical insulating spacing means having an aperture extending therethrough between opposite supporting ends,
said first and second mounting plates being supported at said opposite ends respectively of said spacing means in a manner to face surfaces of like polarity of said elements in the same direction, and
means for electrically connecting said piezoelectric elements together in parallel,
said mounting plates are metallic mounting plates,
one element of each pair is soldered to its mounting plate and one element of each pair is cemented with electrically conductive cement to its mounting plate,
the combined capacitance of the elements of one pair matches the combined capacitance of the elements of the other pair,
said elements and said mounting plates are disc shaped,
said elements of each pair having a diameter smaller than the diameter of their mounting plate,
said spacing means being an annular member having an inside diameter greater than the diameter of said elements,
the first and second mounting plates are supported at said opposite ends of said spacing means to face outward the crystals soldered to their mounting plates,
said means for electrically connecting said piezoelectric elements together in parallel comprising:
first conductive means electrically coupling the unattached surfaces of said first pair of elements together and to said second mounting plate,
second conductive means electrically coupling the unattached surfaces of said second pair of elements together and to said first mounting plate,
said first conductive means extends on the outside of said spacing means from the outer element of said first pair to said second mounting plate and through said second mounting plate to the inner element of said first pair,
said second conductive means extends on the outside of said spacing means from the outer element of said second pair to said first mounting plate and through said first mounting plate to the inner element of said second pair.

* * * * *